United States Patent
Xu et al.

(10) Patent No.: US 6,576,394 B1
(45) Date of Patent: Jun. 10, 2003

(54) NEGATIVE-ACTING CHEMICALLY AMPLIFIED PHOTORESIST COMPOSITION

(75) Inventors: Pingyong Xu, Basking Ridge, NJ (US); Ping-Hung Lu, Bridgewater, NJ (US); Ralph R. Dammel, Flemington, NJ (US)

(73) Assignee: Clariant Finance (BVI) Limited (VG)

( * ) Notice: Subject to any disclaimer, the term of this patent is extended or adjusted under 35 U.S.C. 154(b) by 0 days.

(21) Appl. No.: 09/596,098

(22) Filed: Jun. 16, 2000

(51) Int. Cl.$^7$ .............................................. G03C 1/492
(52) U.S. Cl. ..................... 430/270.1; 430/311; 430/325; 430/905; 430/921
(58) Field of Search .............................. 430/270.1, 905, 430/921, 311, 325

(56) References Cited

U.S. PATENT DOCUMENTS

| | | | |
|---|---|---|---|
| 4,540,598 A | | 9/1985 | Berner et al. |
| 5,494,777 A | * | 2/1996 | Shiraki et al. ............... 430/270 |
| 5,627,011 A | | 5/1997 | Munzel et al. |
| 5,700,625 A | | 12/1997 | Sato et al. |
| 5,925,495 A | * | 7/1999 | Sato et al. ................ 430/270.1 |
| 6,187,500 B1 | * | 2/2001 | Miyagi et al. ............... 430/166 |

FOREIGN PATENT DOCUMENTS

| | | |
|---|---|---|
| EP | 0 768 572 A | 4/1997 |
| EP | 0 621 508 A | 7/1999 |
| WO | WO 9810335 A1 | 3/1998 |

OTHER PUBLICATIONS

PCT International Search Report for PCT/EP01/05840.

* cited by examiner

*Primary Examiner*—Rosemary Ashton
(74) *Attorney, Agent, or Firm*—Andrew F. Sayko, Jr.; Alan P. Kass

(57) ABSTRACT

A chemically-amplified, negative-acting, radiation-sensitive photoresist composition that is developable in an alkaline medium, the photoresist comprising:
  a) a phenolic film-forming polymeric binder resin having ring bonded hydroxyl groups;
  b) a photoacid generator that forms an acid upon exposure to radiation, in an amount sufficient to initiate crosslinking of the film-forming binder resin;
  c) a crosslinking agent that forms a carbonium ion upon exposure to the acid from step b) generated by exposure to radiation, and which comprises an etherified aminoplast polymer or oligomer;
  d) a second crosslinking agent that forms a carbonium ion upon exposure to the acid from step b) generated by exposure to radiation, and which comprises either 1) a hydroxy substituted- or 2) a hydroxy $C_1$–$C_4$ alkyl substituted-$C_1$–$C_{12}$ alkyl phenol, wherein the total amount of the crosslinking agents from steps c) and d) is an effective crosslinking amount; and
  e) a photoresist solvent,
and a process for producing a microelectronic device utilizing such a photoresist composition.

15 Claims, No Drawings

NEGATIVE-ACTING CHEMICALLY AMPLIFIED PHOTORESIST COMPOSITION

BACKGROUND OF THE INVENTION

The present invention relates to a chemically amplified, negative-acting, radiation-sensitive photoresist composition and to a method for producing microelectronic devices using such a photoresist. The photoresists of the present invention comprise a phenolic film-forming binder resin having ring bonded hydroxyl groups, a combination of at least two chemically dissimilar cross linking agents, and a compound that generates acid upon exposure to imaging radiation (a photoacid generator).

Photoresist compositions are used in microlithographic processes for making miniaturized electronic components such as in the fabrication of computer chips and integrated circuits. Generally, in these processes, a thin film of a photoresist composition is first applied to a substrate material, such as silicon wafers used for making integrated circuits. The coated substrate is then baked to evaporate solvent in the photoresist composition and to fix the coating onto the substrate. The baked, coated surface of the substrate is next subjected to an image-wise exposure to imaging radiation.

This radiation exposure causes a chemical transformation in the exposed areas of the coated surface. Visible light, ultraviolet (UV) light, electron beam and X-ray radiant energy are imaging radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

The use of a negative-working, acid-sensitive photoresist composition is known in the prior art. Most of such prior art photoresist compositions use a crosslinking agent that reacts with the polymeric binder resin to form an insoluble film comprising a higher molecular weight polymer.

SUMMARY OF THE INVENTION

The present invention relates to a chemically-amplified, negative-acting, radiation-sensitive photoresist composition that is developable in an alkaline medium, the photoresist comprising:

a) a phenolic film-forming polymeric binder resin having ring bonded hydroxyl groups;
b) a photoacid generator that forms an acid upon exposure to radiation, in an amount sufficient to initiate crosslinking of the film-forming binder resin;
c) a crosslinking agent that forms a carbonium ion upon exposure to the acid from step b) generated by exposure to radiation, and which comprises an etherified aminoplast polymer or oligomer;
d) a second crosslinking agent that forms a carbonium ion upon exposure to the acid from step b) generated by exposure to radiation, and which comprises either: 1) a hydroxy substituted- or 2) a hydroxy $C_1$–$C_4$ alkyl substituted-$C_1$–$C_{12}$ alkyl phenol, wherein the total amount of the crosslinking agents from steps c) and d) is an effective crosslinking amount; and
e) a photoresist solvent.

The present invention also relates to a process for producing a microelectronic device, such as a semiconductor, the process comprising:

a) providing a negative-acting photoresist composition comprising:
1) a phenolic film-forming polymeric binder resin having ring bonded hydroxyl groups;
2) a photoacid generator that forms an acid upon exposure to radiation, in an amount sufficient to initiate crosslinking of the film-forming binder resin from step 1);
3) a crosslinking agent that forms a carbonium ion upon exposure to the acid from step 2) generated by exposure to radiation, and which comprises an etherified aminoplast polymer or oligomer;
4) a second crosslinking agent that forms a carbonium ion upon exposure to the acid from step 2) generated by exposure to radiation, and which comprises either: a hydroxy substituted- or a hydroxy $C_1$–$C_4$ alkyl substituted-$C_1$–$C_{12}$ alkyl phenol, wherein the total amount of the crosslinking agents from steps 3) and 4) is an effective crosslinking amount; and
5) a photoresist solvent.
b) coating the photoresist composition from step a) onto the surface of a suitable substrate;
c) heat treating the coated substrate from step b) until substantially all of the photoresist solvent is removed from the photoresist composition;
d) imagewise exposing the coated photoresist composition from step c) to imaging radiation;
e) heating the substrate after the exposure in step d) and
f) removing the unexposed areas of the coated photoresist composition from step d) with a developer.

DESCRIPTION OF THE PREFERRED EMBODIMENTS

The compositions of the present invention comprise chemically amplified, negative-acting photoresists sensitive to imaging radiation such as electron beams, ion beams, ultraviolet light or x-rays. These compositions are chemically amplified by having one photon or energetic particle absorbed by the acid generator, which provides one acid molecule that can subsequently catalyze many crosslinking reactions. The generation of acid from the radiation sensitive photoacid generator does not require heat, and exposure to imaging radiation is sufficient.

The phenolic film-forming polymeric binder resin utilized in the photoresist compositions of the present invention is preferably a hydroxyaromatic polymer that is soluble in an alkaline medium such as an aqueous alkaline developer, but insoluble in water. These binder resins are capable of undergoing crosslinking in the presence of a crosslinking agent. The binder resins are chosen so that the photoresist compositions of the present invention are soluble in alkaline medium, such as an aqueous alkaline developer, before being crosslinked. However, these compositions then become insoluble in such alkaline medium after crosslinking.

Preferred binder resins may comprise a novolak, preferably derived from a substituted phenol such as ortho-cresol; meta-cresol; para-cresol; 2,4-xylenol; 2,5-xylenol; 3,4-xylenol, 3,5-xylenol, thymol and mixtures thereof, that has been condensed with an aldehyde such as formaldehyde. The binder resin may also comprise a poly(vinyl phenol) such as a poly(para-hydroxystyrene); a poly(para-hydroxy-alpha-methylstyrene; a copolymer of para-hydroxystyrene or para-hydroxy-alpha-methylstyrene and styrene, acetoxystyrene or acrylic acid and/or methacrylic acid; a hydroxyphenylalkyl carbinol homopolymer; or a novolak/poly(vinyl phenol) copolymer.

The etherified aminoplast crosslinking agent comprises an organic oligomer or polymer that provides a carbonium ion upon and serves to crosslink the film-forming binder resin in the presence of an acid generated by radiation, preferably imaging radiation. This renders the binder resin insoluble in an alkaline medium, in the exposed areas. Such crosslinking agents may be prepared from a variety of aminoplasts in combination with a compound or low molecular weight polymer containing a plurality of hydroxyl, carboxyl, amide or imide groups. Preferred amino oligomers or polymers are aminoplasts obtained by the reaction of an amine, such as urea, melamine, or glycolurea with an aldehyde, such as formaldehyde. Such suitable aminoplasts include urea-formaldehyde, melamine-formaldehyde, benzoguanamine-formaldehyde, and gylcoluril-formaldehyde resins, and combinations of any of these. A particularly preferred aminoplast is hexa(methoxymethyl) melamine oligomer.

The hydroxy-substituted alkyl phenol crosslinking agent comprises an organic polymer that provides a carbonium ion and also serves to crosslink the film-forming binder resin in the presence of an acid generated by radiation. This renders the binder resin insoluble in an alkaline medium, in the exposed areas. Such crosslinking agents include mono- and di-hydroxy-substituted phenols such as a dialkylol cresol, e.g. a dialkylol- (e.g. dimethylol-) para-cresol. Preferred dialkylol cresols comprise mono- or di-hydroxy $C_1$–$C_4$ alkyl substituted (mono-, di-, tri- or tetra-$C_1$–$C_{12}$ alkyl) phenol, such as a dihydroxyalkyl-(tetra-alkyl)-phenol. Particularly preferred cross-linking agents are the 2,6-dihydroxyalkyl-4-(tetra-alkyl) phenols, such as 2,6-dihydroxymethyl-4-(1,1,3,3-tetramethylbutyl) phenol.

The photoacid generator, upon exposure to radiation such as UV light, generates the amount of acid necessary to catalyze the crosslinking of the polymeric binder resin in the photoresist composition. This provides the final differences in solubility between the exposed and unexposed areas of the photoresist film on the substrate. The preferred photoacid generator is a radiation sensitive oxime sulfonate, such as disclosed in U.S. Pat. Nos. 4,540,598 and 5,627,011. As the photoresist composition is exposed to radiation, especially actinic radiation, the oxime sulfonate generates acid, so that crosslinking takes place during the post exposure baking process, in which the exposed areas of the photoresist composition become insoluble in the customary alkaline medium, such as an aqueous alkaline developer. The preferred oxime sulfonates utilized in the photoresist compositions of the present invention have the formula:

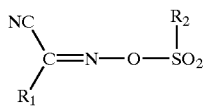

wherein $R_1$ and $R_2$ may be $C_1$–$C_4$ alkyl or halogenated alkyl; phenyl; or naphthyl; or phenyl or naphthyl substituted with a nitro-, chloro-, bromo-, hydroxyl, $C_1$–$C_4$ alkyl, $C_1$–$C_4$ fluoroalkyl, or $C_1$–$C_4$ alkoxy.

A Suitable solvents for such photoresist compositions may include propylene glycol mono-alkyl ether, propylene glycol alkyl (e.g. methyl) ether acetate, 2-heptanone, 3-methoxy-3-methyl butanol, butyl acetate, anisole, xylene, diglyme, ethylene glycol monoethyl ether acetate, ethylene glycol monomethyl ether, ethylene glycol monoethyl ether, diethylene glycol monoethyl ether, ethylene glycol monoethyl ether acetate, ethylene glycol monomethyl acetate, methyl ethyl ketone, 2-heptanone or a monooxymonocarboxylic acid ester, such as methyl oxyacetate, ethyl oxyacetate, butyl oxyacetate, methyl methoxyacetate, ethyl methoxyacetate, butyl methoxyacetate, methyl ethoxyactetate, ethyl ethoxyacetate, ethoxy ethyl propionate, methyl 3-oxypropionate, ethyl 3-oxypropionate, methyl 3-methoxypropionate, ethyl 3-methoxypropionate, methyl 2-oxypropionate, ethyl 2-oxypropionate, ethyl 2-hydroxypropionate (ethyl lactate), ethyl 3-hydroxypropionate, propyl 2-oxypropionate, methyl 2-ethoxypropionate, or propyl 2-methoxy propionate, or mixtures of one or more of these. The photoresist solvent(s) may be present in the overall photoresist composition in an amount of up to 95% by weight of the solids in the composition. Solvents, of course, are substantially removed after coating of the photoresist solution on a substrate and subsequent drying.

The prepared photoresist solution, can be applied to a substrate by any conventional method used in the photoresist art, including dipping, spraying, whirling and spin coating. When spin coating, for example, the photoresist solution can be adjusted with respect to the percentage of solids content, in order to provide a coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing a hexa-alkyl disilazane, preferably hexamethyl disilazane (HMDS).

The photoresist composition solution is then coated onto the substrate, and the substrate is heat treated. This temperature treatment is selected in order to reduce the concentration of residual solvents in the photoresist, while not causing substantial thermal degradation of the photosensitive component. In general, one desires to minimize the concentration of solvents and this first temperature treatment is conducted until substantially all of the solvents have evaporated and a thin coating of photoresist composition, on the order of one micron in thickness, remains on the substrate. The heat treatment is conducted until the rate of change of solvent removal becomes relatively insignificant. The temperature and time selection depends on the photoresist properties desired by the user, as well as the equipment used and commercially desired coating times. The coated substrate can then be exposed to actinic radiation, in any desired pattern, produced by use of suitable masks, negatives, stencils, templates, etc. The photoresist is then subjected to a post exposure second baking or heat treatment, before development.

The exposed negative-acting photoresist-coated substrates are developed to remove the unexposed areas, normally by immersion in an alkaline developing solution or developed by a spray development process. The solution is preferably agitated, for example, by nitrogen burst agitation. The substrates are allowed to remain in the developer until all, or substantially all, of the photoresist coating has dissolved from the unexposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. The photoresist compositions of the present invention are resistant to acid-base etching solutions and provide effective protection for the unexposed photoresist-coating areas of the substrate.

Typical photoresist compositions of the present invention may comprise up to about 50 percent by weight, based on the total weight of the photoresist composition. The solids may comprise from 1 to 15 weight percent of the photoacid generator, 40 to 80 weight percent of the phenolic resin binder and from 5 to 30 weight percent of the crosslinking agents, based on the total solids content of the photoresist composition.

In a particularly preferred embodiment of the present invention, an I-line sensitive dye may also be added to the photoresist composition. Such dyes may include Sudan Orange G; Martins Yellow; Dye O-PM ester; 2,3',4,4'-tetramethylhydroxybenzo-phenone, 9-anthracene methanol; phenoxymethyl anthracene; 9,10-diphenylanthracene; substituted phenanthracenes and substituted biphenyls. Generally, from about 1 to 10 percent, based on the total weight of solids, of such a dye may be added.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

COMPARATIVE EXAMPLE 1

A photoresist composition was prepared by providing an admixture of 2.1827 gm. VPN 1109 (18.5909%), 0.1267 gm. DM-POP (1.0792%), 0.0396 gm. PAI-101 (0.3371%), 0.1718 gm. of a 2% solution of FC 430 in PGMEA (1.4632%), and 9.2199 gm. PGMEA (78.5296%).

1) VPN 1109 is a meta-cresol/formaldehyde novolak resin available form Clariant Corporation.
2) DM-POP is 2,6-dihydroxymethyl-4-(1,1,3,3-tetramethylbutyl) phenol available from Honshu Chemical Company.
3) PAI-101 is 4-methoxy-alpha(((4-methylphenyl)sulfonyl)oxy)imino benzene acetonitrile available from Midori Kagaku Company.
4) FC 430 is a fluorinated surfactant available from 3M Corp.
5) PGMEA is propylene glycol methyl ether acetate.

COMPARATIVE EXAMPLE 2

A photoresist composition was prepared by providing an admixture of 6.0070 gm. VPN 1109 (20.0234%), 2.1100 gm. Cymel 303 (7.0335%), 0.02831 gm. PAI-101 (0.9436%), 0.4500 gm. of a 2% solution of FC 430 in PGMEA (1.5000%), and 21.1499 gm. PGMEA (70.4996%).

Cymel 303 is hexamethylolmelamine hexamethyl ether available from Cytec Industries.

EXAMPLE 3

A photoresist composition was prepared by providing an admixture of 2.3426 gm. VPN 1109 (19.2016%), 0.0755 gm. DM-POP (0.6189%), 0.3657 gm. Cymel 303 (2.9975%), 0.0727 gm. PAI-101 (0.5959%), 0.1804 gm. of a 2% solution of FC 430 in PGMEA (1.4787%), and 9.1631 gm. PGMEA (75.1074%).

EXAMPLE 4

The photoresist compositions of Comparative Example 1, Comparative Example 2, and Example 3 were each coated onto a 6 inch silicon wafer to each provide a photoresist film thickness of 1.17 micrometer (micron). The coated wafers were then each soft baked on a hot plate for 60 seconds at 90° C. The wafers were then each exposed on a Nikon® 0.54 NA I-line stepper at the exposure doses listed below. Each exposed wafer was then post exposure baked on a hot plate for 60 seconds at 110° C. The wafers were than each puddle developed using AZ® 300 MIF developer (2.38% Tetramethylammonium hydroxide solution) for 60 seconds at 23° C. The photoresist compositions of Comparative Examples 1 and 2 provided pattern profiles that were unacceptable because the walls of the profiles were no where near vertical. The photoresist composition of Example 3 provided very acceptable profiles having substantially vertical walls. Exposure doses on the I-line stepper for the photoresists from Examples 1, 2, and 3 were, respectively, 48 mJ/cm$^2$, 26 mJ/cm$^2$, and 30 mJ/cm$^2$.

EXAMPLE 5

A photoresist composition was prepared by providing an admixture of 19.2016 gm. VPN 1109, 0.6189 gm. DM-POP, 2.29975 gm. Cymel 303, 0.5959 gm. PAI-101, 1.4787 gm. of a 2% solution of FC 430 in PGMEA, and 75.1074 gm. PGMEA.

EXAMPLE 6

A photoresist composition was prepared by providing an admixture of 19.2016 gm. VPN 1109, 0.6189 gm. DM-POP, 2.29975 gm. Cymel 303, 0.5959 gm. CGI 131 Oxime Sulfonate (available from Ciba), 1.4787 gm. of a 2% solution of FC 430 in PGMEA, and 75.1074 gm. PGMEA.

EXAMPLE 7

A photoresist composition was prepared by providing an admixture of 19.2016 gm. VPN 1109, 0.6189 gm. DM-POP, 2.29975% Cymel 303, 0.5959 gm. OP9141E 1-sulfonyloxy-2-pyridone, 1.4787 gm. of a 2% solution of FC 430 in PGMEA, and 75.1074 gm. PGMEA.

EXAMPLE 8

A photoresist composition was prepared by providing an admixture of 19.2016 gm. VPN 1109, 0.6189 gm. DM-POP, 2.29975 gm. Cymel 303, 0.5959 gm. PAI-101, 0.19515 gm. 9-anthracenemethanol, 1.4787 gm. of a 2% solution of FC 430 in PGMEA, and 75.1074 gm. PGMEA.

EXAMPLE 9

A photoresist composition was prepared by providing an admixture of 24.6033 gm. VPN 1109, 0.7929gm. DM-POP, 3.8408 gm. Cymel 303, 0.7635 gm. PAM-101, 1.8947 gm. of a 2% solution of FC 430 in PGMEA, and 68.1048 gm. PGMEA.

EXAMPLE 10

A photoresist composition was prepared by providing an admixture of 26.0477 gm. of a Poly(hydroxystyrene)/Styrene 10013-77-FDP copolymer (available from Triquest), 0.8395gm. DM-POP, 2.7798 gm. Cymel 303, 0.3336 gi. PAI-101 , 2.0059 gm. of a 2% solution of FC 430 in PGMEA, and 67.9936 gm. PGMEA.

EXAMPLE 11

A photoresist composition was prepared by providing an admixture of 26.7295 gm. of a Poly(hydroxystyrene)/Styrene FK-070 copolymer (available from Maruzen), 0.4805 gm. DM-POP, 2.3274 gm. Cymel 303, 0.4627 gm. PAI-101, 1.1481 gm. of a 2% solution of FC 430 in PGMEA, and 68.8519 gm. PGMEA.

EXAMPLE 12

A photoresist composition was prepared by providing an admixture of 24.6033 gm. of a Poly(hydroxystyrene)/Novolak 10004-153-2B copolymer (available from Triquest), 0.4805 gm. DM-POP, 2.3274 gm. Cymel 303, 0.4627 gm. PAI-101, 1.1481 gm. of a 2% solution of FC 430 in PGMEA, and 68.8519 gm. PGMEA.

EXAMPLE 13

The photoresist compositions of Examples 5 to 12 were each coated onto a 6-inch silicon wafer to each provide a photoresist film thickness of 1.00 micrometer (micron). The coated wafers were then each soft baked on a hot plate for 60 seconds at 90° C. The wafers were then each exposed on a Nikon® 0.54 NA I-line stepper at the exposure doses listed below. Each exposed wafer was then post exposure baked on a hot plate for 60 seconds at 110 ° C. The wafers were than each puddle developed using AZ® 300 MIF developer (2.38% Tetramethylammonium hydroxide solution) for 60 seconds at 23° C. The photoresist composition of Examples 5 to 12 each provided very acceptable profiles having substantially vertical walls. The exposure doses for the photoresists from Example 5 through Example 12, respectively, were as follows:

| Example No. | Exposure dose (mJ/cm$^2$) |
| --- | --- |
| 5 | 30 |
| 6 | 68 |
| 7 | 10 |
| 8 | 22 |
| 9 | 18 |
| 10 | 26 |
| 11 | 32 |
| 12 | 26 |

Unless otherwise stated, all parts and percentages are by weight; alkyl is $C_1$ to $C_4$ alkyl; alkoxy is $C_1$ to $C_4$ alkoxy; all temperatures are in degrees Centigrade; and all molecular weights are weight average molecular weights.

We claim:

1. A chemically-amplified, negative-acting, radiation-sensitive photoresist composition that is developable in an alkaline medium, the photoresist comprising:
   a) a phenolic film-forming polymeric binder resin having ring bonded hydroxyl groups;
   b) a photoacid generator that forms an acid upon exposure to radiation, in an amount sufficient to initiate crosslinking of the film-forming binder resin;
   c) a crosslinking agent that forms a carbonium ion upon exposure to the acid of b) generated by exposure to radiation, and which comprises an etherified aminoplast polymer or oligomer;
   d) a second crosslinking agent that forms a carbonium ion upon exposure to the acid of b) generated by exposure to radiation, and which comprises dihydroxyalkyl-(tetra)-phenol, wherein the total amount of the crosslinking agents of c) and d) is an effective crosslinking amount; and
   e) a photoresist solvent.

2. The photoresist composition of claim 1, wherein the polymeric binder resin of a) comprises a novolak derived from a substituted phenol selected from ortho-cresol; meta-cresol; para-cresol; 2,4xylenol; 2,5-xylenol; 3,4xylenol, 3,5-xylenol, thymol and mixtures thereof, that has been condensed with an aldehyde; a poly(vinyl phenol); or poly(vinyl phenol) copolymer.

3. The photoresist composition of claim 2, wherein the aldehyde is formaldehyde.

4. The photoresist composition of claim 1, wherein the crosslinking agent of c) is an etherified aminoplast oligomer or polymer obtained by the reaction of an amine with an aldehyde.

5. The photoresist composition of claim 1, wherein the etherified aminoplast oligomer or polymer of c) is a hexa (methoxymethyl) melamine.

6. The photoresist composition of claim 1, wherein the photoacid generator of b) is an oxime sulfonate.

7. The photoresist composition of claim 6, wherein the oxime sulfonate has the formula:

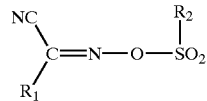

wherein $R_1$ and $R_2$ are $C_1$–$C_4$ alkyl or halogenated alkyl; phenyl; naphthyl; or phenyl or naphthyl substituted with a nitro-, chloro-, bromo-, hydroxyl, $C_1$–$C_4$ alkyl, $C_1$–$C_4$ fluoroalkyl, or $C_1$–$C_4$ alkoxy.

8. A process for producing a microelectronic device comprising:
   a) providing a negative-acting photoresist composition comprising:
      1) a phenolic film-forming polymeric binder resin having ring bonded hydroxyl groups;
      2) a photoacid generator that forms an acid upon exposure to radiation, in an amount sufficient to initiate crosslinking of the film-forming binder resin;
      3) a crosslinking agent that forms a carbonium ion upon exposure to the acid from step 2) generated by exposure to radiation, and which comprises an etherified aminoplast polymer or oligomer;
      4) a second crosslinking agent that forms a carbonium ion upon exposure to the acid from step 2) generated by exposure to radiation, and which comprises a dihydroxyalkyl-(tetra-alkyl)phenol, wherein the total amount of the crosslinking agents from steps 3) and 4) is an effective crosslinking amount; and 5) a photoresist solvent;

b) coating the photoresist composition from step a) onto the surface of a suitable substrate;

c) heat treating the coated substrate from step b) until substantially all of the photoresist solvent is removed from the photoresist composition;

d) imagewise exposing the coated photoresist composition from step c) to imaging radiation;

e) heating the substrate after the exposure in step d); and f) removing the unexposed areas of the coated photoresist composition from step d) with a developer.

9. The process of claim 8, wherein the polymeric binder resin of step 1) comprises a novolak derived from a substituted phenol selected from ortho-cresol; meta-cresol; para-cresol; 2,4-xylenol; 2,5-xylenol; 3,4-xylenol, thymol and mixtures thereof, that has been condensed with an aldehyde; a poly(vinyl phenol); or a poly(vinyl phenol) copolymer.

10. The process of claim 9, wherein the aldehyde is formaldehyde.

11. The process of claim 8, wherein the crosslinking agent of step 3) is an etherified aminoplast oligomer or polymer obtained by the reaction of an amine with an aldehyde.

12. The process of claim 8, wherein the etherified aminoplast oligomer or polymer of step 3 is a hexa (methoxymethyl) melamine.

13. The process of claim 8, wherein the photoacid generator of step 2) is an oxime sulfonate.

14. The process of claim 13, wherein the oxime sulfonate has the formula:

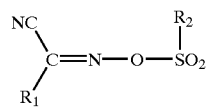

wherein $R_1$ and $R_2$ are $C_1$–$C_4$ alkyl or halogenated alkyl; phenyl; naphthyl; or phenyl or naphthyl substituted with a nitro-, chloro-, bromo-, hydroxyl, $C_1$–$C_4$ alkyl, $C_1$–$C_4$ fluoroalkyl, or $C_1$–$C_4$ alkoxy.

15. A process for producing a negative-acting photoresist composition comprising providing in admixture:

a) a phenolic film-forming polymeric binder resin having ring bonded hydroxyl groups;

b) a photoacid generator that forms an acid upon exposure to radiation, in an amount sufficient to initiate crosslinking of the film-forming binder resin;

c) a crosslinking agent that forms a carbonium ion upon exposure to the acid from step b) generated by exposure to radiation, and which comprises an etherified aminoplast polymer or oligomer;

d) a second crosslinking agent that forms a carbonium ion upon exposure to the acid from step b) generated by exposure to radiation, and which comprises a dihydroxyalkyl-(tetra-alkyl)phenol, wherein the total amount of the crosslinking agents from steps c) and d) is an effective crosslinking amount; and e) a photoresist solvent.

* * * * *